US010453363B2

(12) United States Patent
Wei et al.

(10) Patent No.: US 10,453,363 B2
(45) Date of Patent: Oct. 22, 2019

(54) ANNULAR DISPLAY APPARATUS AND DISPLAY DEVICE (71) Applicant: SHANGHAI TIANMA MICRO-ELECTRONICS CO., LTD., Shanghai (CN)

(72) Inventors: Meng Wei, Shanghai (CN); Jiubin Zhou, Shanghai (CN); Lingling Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/203,643

(22) Filed: Nov. 29, 2018

(65) Prior Publication Data
US 2019/0096291 A1 Mar. 28, 2019

(30) Foreign Application Priority Data
Feb. 27, 2018 (CN) .......................... 2018 1 0164182

(51) Int. Cl.
G09F 9/30 (2006.01)
H01L 27/12 (2006.01)
H05K 1/18 (2006.01)
H05K 1/14 (2006.01)
H05K 3/36 (2006.01)

(52) U.S. Cl.
CPC ............ G09F 9/301 (2013.01); H01L 27/124 (2013.01); H05K 1/147 (2013.01); H05K 1/189 (2013.01); H05K 3/361 (2013.01); H05K 2201/056 (2013.01); H05K 2201/09027 (2013.01); H05K 2201/10128 (2013.01)

(58) Field of Classification Search
None
See application file for complete search history.

(56) References Cited

U.S. PATENT DOCUMENTS 9,940,866 B2* 4/2018 Lin .......................... G09G 3/20
10,026,799 B2* 7/2018 Jeong .................. H01L 27/3276
10,134,327 B2* 11/2018 Park ..................... G09G 3/2092
(Continued)

FOREIGN PATENT DOCUMENTS

CN 101443695 A 5/2009

Primary Examiner — Dimary S Lopez Cruz
(74) Attorney, Agent, or Firm — Kilpatrick Townsend & Stockton LLP (57) ABSTRACT An annular display apparatus and a display device are provided. The annular display apparatus includes a display panel, an integrated circuit chip and a flexible printed circuit. The display panel includes an annular display region, an outer non-display region and an inner non-display region, the display region is provided with multiple control signal lines, the inner non-display region is provided with multiple panel binding interfaces, and the multiple control signal lines are electrically connected to the multiple panel binding interfaces respectively. The flexible printed circuit includes a bonding region and a chip region, the bonding region is provided with multiple circuit board binding interfaces which are bound to to the multiple panel binding interfaces, the chip region is configured to arrange the integrated circuit chip, and the integrated circuit chip is electrically connected to the multiple circuit board binding interfaces.

16 Claims, 12 Drawing Sheets (56) References Cited

U.S. PATENT DOCUMENTS

| | | | |
|---|---|---|---|
| 10,325,559 B2* | 6/2019 | Lee | G09G 3/3258 |
| 2008/0266210 A1* | 10/2008 | Nonaka | G09G 3/20 |
| | | | 345/55 |
| 2009/0195721 A1* | 8/2009 | Tanahara | G02F 1/136213 |
| | | | 349/39 |
| 2009/0267870 A1 | 10/2009 | Schellingerhout et al. | |
| 2010/0134743 A1* | 6/2010 | Shin | G02F 1/13 |
| | | | 349/143 |
| 2010/0141874 A1* | 6/2010 | Morita | G02F 1/133514 |
| | | | 349/106 |
| 2010/0289994 A1* | 11/2010 | Nonaka | G02F 1/133514 |
| | | | 349/108 |
| 2015/0355487 A1* | 12/2015 | Emmert | G02F 1/13306 |
| | | | 349/33 |
| 2016/0027380 A1* | 1/2016 | Kim | G09G 3/3258 |
| | | | 315/172 |
| 2016/0035284 A1* | 2/2016 | Jung | G06F 1/163 |
| | | | 345/206 |
| 2016/0113106 A1* | 4/2016 | Kim | H05K 1/028 |
| | | | 361/749 |
| 2016/0190166 A1* | 6/2016 | Kim | H01L 27/124 |
| | | | 257/71 |
| 2016/0232837 A1* | 8/2016 | Lee | G09G 3/3688 |
| 2017/0168463 A1* | 6/2017 | Hong | G02F 1/1345 |

* cited by examiner

ANNULAR DISPLAY APPARATUS AND DISPLAY DEVICE

This application claims the priority to Chinese Patent Application No. 201810164182.4, titled "ANNULAR DISPLAY MODULE AND DISPLAY DEVICE", filed on Feb. 27, 2018 with the Chinese Patent Office, which is incorporated herein by reference in its entirety.

FIELD

The present disclosure relates to the field of displaying, and in particular to an annular display apparatus and a display device.

BACKGROUND

With the application of the display technology in smart wearable devices and other portable electronic devices, various requirements are imposed on an appearance of a display device, and various display apparatuses adapted to the appearance of the display device are developed. The main difference between a non-rectangular display apparatus and a conventional display apparatus is that, the non-rectangular display apparatus has a special shape other than a rectangular shape, such as a circular shape, an annular shape and a rounded rectangle shape.

Figure 1:
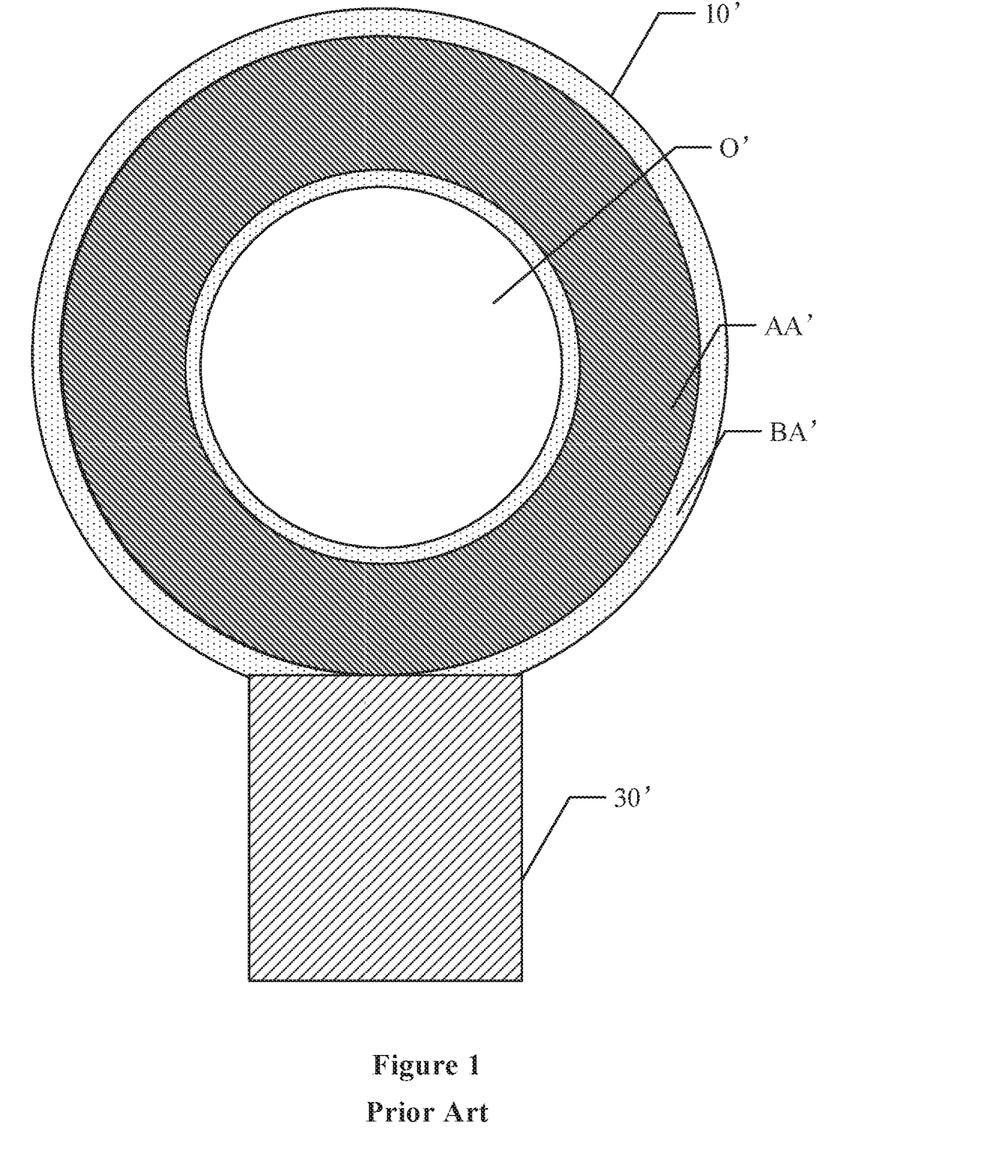
FIG. 1 is a schematic structural diagram of annular display apparatus according to the conventional technology.

The annular display apparatus according to the conventional technology includes an annular display panel and a flexible printed circuit bound to a lower side of an outer ring of the display panel. FIG. 1 is a schematic diagram of an annular display apparatus according to the conventional technology. As shown in FIG. 1, the annular display apparatus includes a display panel 10' and a flexible printed circuit 30'. A hollow region O' is arranged at a center of the display panel 10'. The display region AA' has an annular shape, and the flexible printed circuit 30' is bound to a non-display region BA' surrounding an outer side of the display region AA'. Although the shape of the display region AN is not affected by the flexible printed circuit 30', and is still annular, the appearance of the entire annular display apparatus is not circular.

Therefore, a problem to be solved in the field to provide an annular display apparatus and a display device, to avoid a problem that the appearance of the display apparatus is affected by the flexible printed circuit bound to the display panel.

SUMMARY

In view of the above, an annular display apparatus and a display device are provided, to solve the problem in the conventional technology that an appearance of a display apparatus is affected by a flexible printed circuit bound to the display panel.

In order to solve the above problem, an annular display apparatus is provided according to the present disclosure.

The annular display apparatus includes a display panel, an integrated circuit chip and a flexible printed circuit. The display panel includes an annular display region, an outer non-display region extending around an outer side of the display region and an inner non-display region extending around an inner side of the display region, the display region is provided with multiple control signal lines, the inner non-display region is provided with multiple panel binding interfaces, and the multiple control signal lines are electrically connected to the multiple panel binding interfaces respectively. The flexible printed circuit includes a bonding region and a chip region, the bonding region is provided with multiple circuit board binding interfaces which are bound to the multiple panel binding interfaces, the chip region is configured to arrange the integrated circuit chip, and the integrated circuit chip is electrically connected to the multiple circuit board binding interfaces.

The display device includes the annular display apparatuses according to any one of the embodiments of the present disclosure.

Compared with the conventional technology, the following beneficial effects can be achieved with the annular display apparatus and the display device according to the present disclosure. The panel binding interfaces on the display panel for binding the flexible printed. circuit is arranged on the inner side of the display panel, the flexible printed circuit can be arranged in the hollow region at the center of the display panel, and the outer ring of the outer non-display region of the display panel is not affected by the flexible printed circuit, such that an appearance of the entire annular display apparatus is not affected.

Embodiments of the present disclosure are presented with reference to the drawings.

BRIEF DESCRIPTION OF THE DRAWINGS

The drawings combined in the specification and constitute a part of the specification show various embodiments of the present disclosure, and are used to explain principles of the present disclosure together with the description thereof.

DETAILED DESCRIPTION OF EMBODIMENTS

Hereinafter, embodiments of the present disclosure are described in detail in conjunction with the drawings. It is to be noted that the relative arrangement of the components and steps, numerical expressions and numerical values set forth in the embodiments are not intended to limit the scope of the present disclosure.

The description of the exemplary embodiments is only illustrative rather than a limitation to the present disclosure and application or usage thereof.

In all of the examples shown and discussed herein, any specific values are to be construed as illustrative only and not as a limitation. Thus, different values may be used in other examples of the exemplary embodiments.

It is to be noted that similar reference numerals and letters indicate similar items in the following figures, and therefore, once an item is defined in one drawing, it is not required to be further discussed in the subsequent figures.

Figure 2:
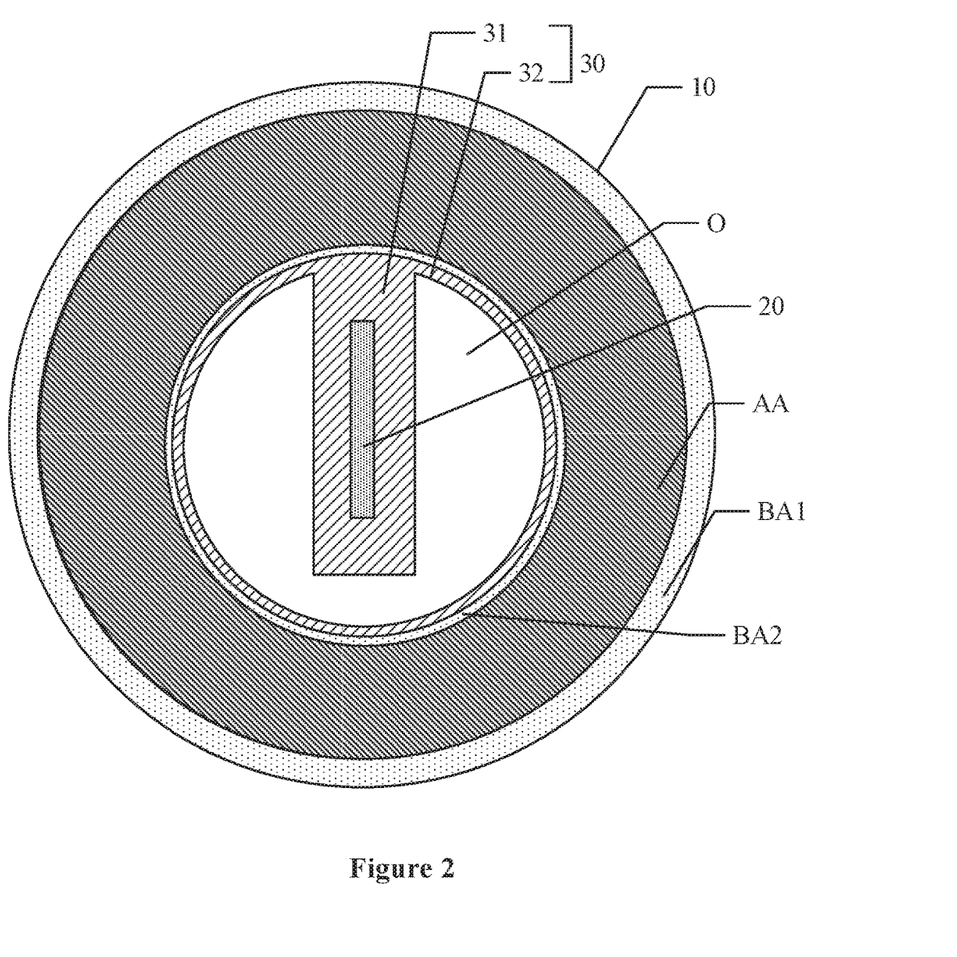
FIG. 2 is a schematic structural diagram of annular display apparatus according to an embodiment of the present disclosure.
Figure 3:
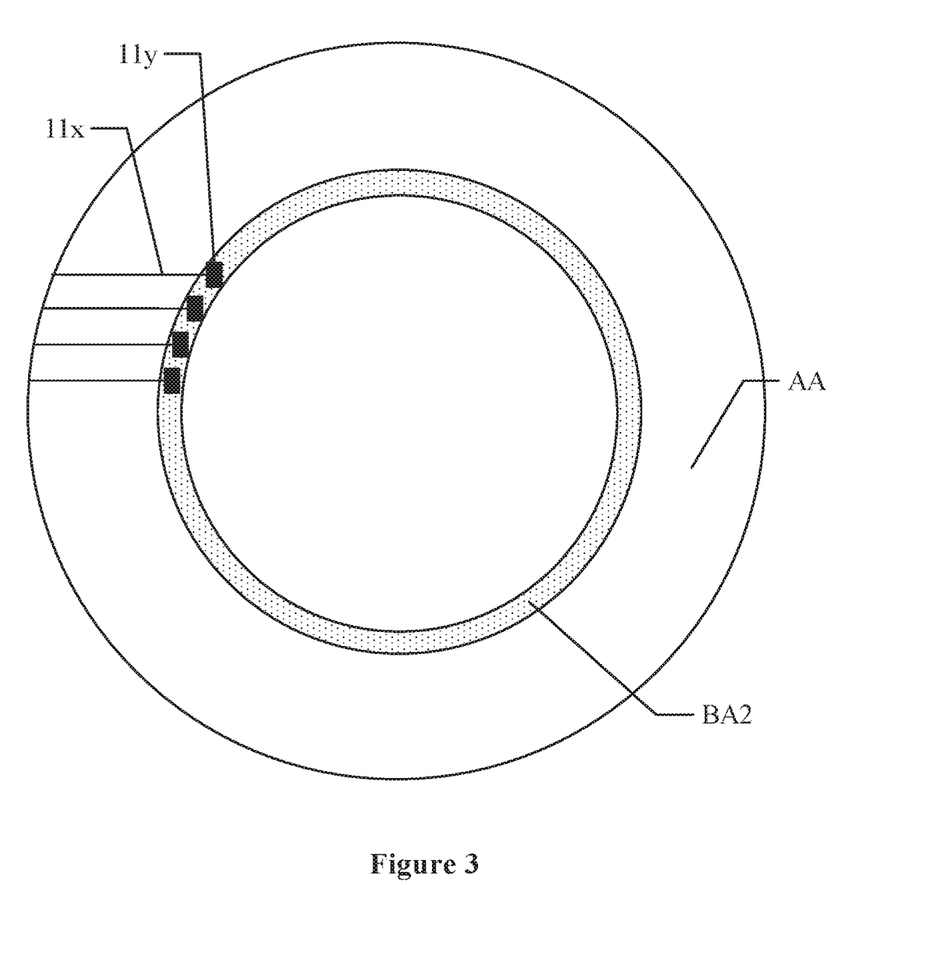
FIG. 3 is a schematic diagram of a display region and an inner non-display region of a display panel in an annular display apparatus according to an embodiment of the present disclosure.
Figure 4:
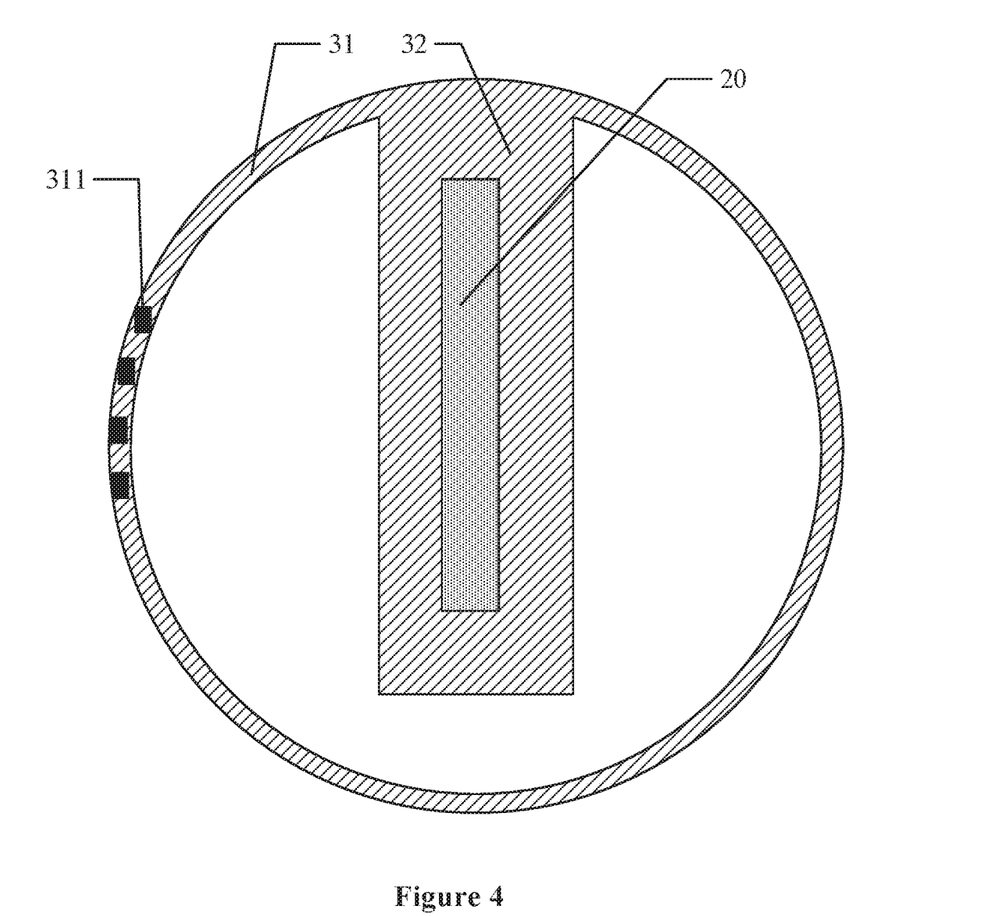
FIG. 4 is a schematic diagram of a flexible printed circuit in an annular display apparatus according to an embodiment of the present disclosure.

FIG. 2 is a schematic structural diagram of an annular display apparatus according to an embodiment of the present disclosure, FIG. 3 is a schematic diagram of a display region and an inner non-display region of a display panel in an annular display apparatus according to an embodiment of the present disclosure, and FIG. 4 is a schematic diagram of a flexible printed circuit in an annular display apparatus according to an embodiment of the present disclosure. In an embodiment, as shown in FIG. 2, the annular display apparatus has a circular annular shape. The annular display apparatus may also have an elliptical annular shape, an approximately circular annular shape, a square annular shape and the like. The annular display apparatus includes a display panel 10, an integrated circuit chip 20 and a flexible printed circuit 30. Specifically, a hollow region O is arranged at the center of the display panel 10, such that the display panel 10 has an annular display region AA, an outer non-display region BA1 extending around an outer side of the display region AA, and an inner non-display region BA2 extending around an inner side of the display region AA. As shown in FIG. 3, multiple display pixels (not shown) and multiple control signal lines 11x for controlling the display pixels to display gray scales are arranged in the display region AA. to Multiple panel binding interfaces 11y are arranged in the inner non-display region BA2. The control signal lines 11x are electrically connected to the panel binding interfaces 11y respectively. It is to be noted that FIG. 3 only schematically shows the control signal lines 11x and the panel binding interfaces 11y, and directions and the number of control signal lines 11x as well as shapes and the number of panel binding interfaces 11y are not limited. In addition, in order to show the control signal lines 11x arranged in the display region AA, the display region AA is not filled with any filling material. As shown in FIG. 4, the flexible printed circuit 30 has a bonding region 31 and a chip region 32. The bonding region 31 is provided with multiple circuit board binding interfaces 311, which are configured to be electrically connected to the multiple panel binding interfaces 11y, to bind the flexible printed circuit 30 to the display panel 10. An integrated circuit chip 20 is arranged in the chip region 32. The integrated circuit chip 20 is electrically connected to the multiple circuit board binding interfaces 311. A display control signal generated by the integrated circuit chip 20 is transmitted to one of the circuit board binding interfaces 311 and transmitted to a display pixel via one of the panel binding interfaces 11y and one of the control signal lines 11x, to realize image display in the display region AA.

With the annular display apparatus according to the embodiment, the panel binding interfaces on the display panel for binding the flexible printed circuit are arranged on the inner side of the display panel, the flexible printed circuit can be arranged in the hollow region at the center of the display panel, and the outer ring of the outer non-display region of the display panel is not affected by the flexible printed circuit, such that the appearance of the entire annular display apparatus is not affected.

In an embodiment, the bonding region of the flexible printed circuit is configured to have an arc shape, to adapt to a shape of the inner non-display region of the display panel. In one embodiment, as shown in FIG. 4, the bonding region 31 is configured to have an annular shape. It is to be noted that this annular shape is not limited to an absolute annular shape, and may be a closed shape, or may be a substantial annular shape having a slit opening. In the embodiment, the bonding region 31 is configured to have an annular shape, and the circuit board binding interfaces 311 may be arranged along a circumference of the annular bonding region. Accordingly, as shown in FIG. 3, the panel binding interfaces 11y may be arranged along a circumference of the inner non-display region BA2 of the display panel. Further, the control signal lines 11x may be led from a position on the circumference of the inner non-display region BA2 to the display region AA, so as to reduce or avoid winding of the control signal lines in the inner non-display region, thereby reducing a width of the inner non-display region BA2 in a radial direction, and increasing a screen-to-body ratio of the annular display apparatus.

Figure 5:
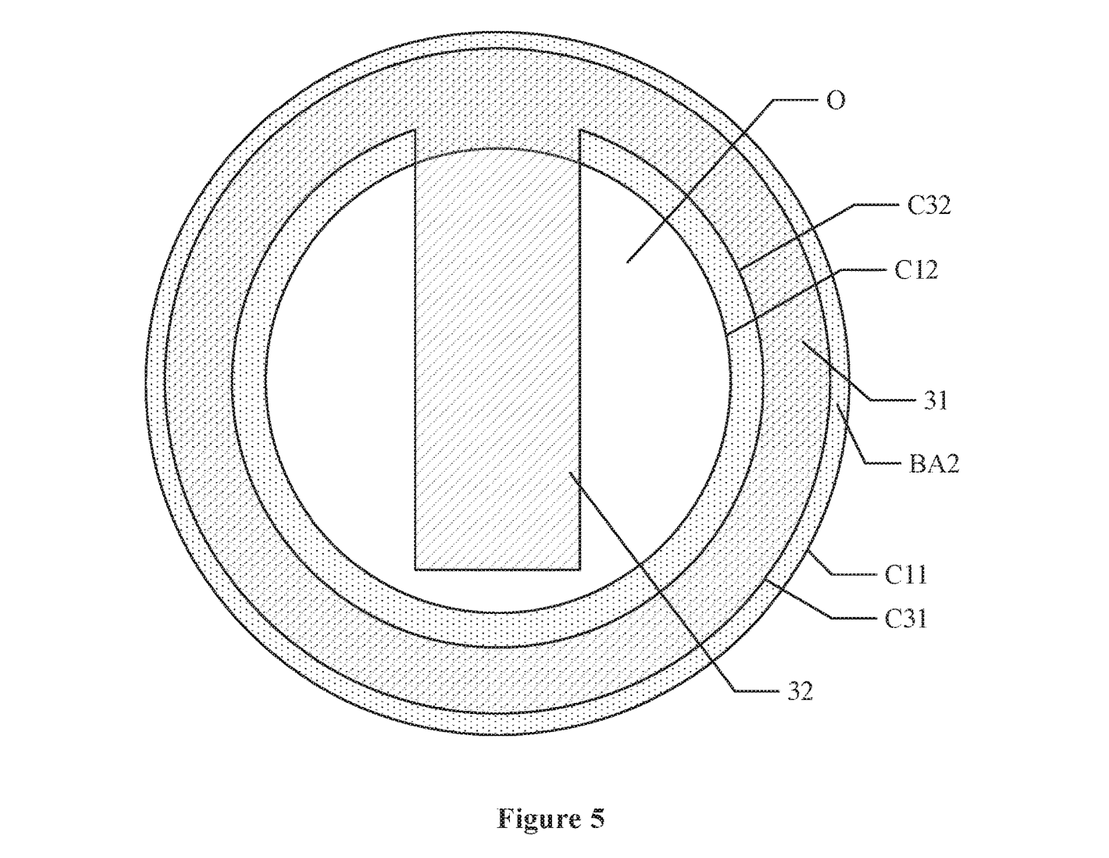
FIG. 5 is a schematic diagram of an inner non-display region of a display panel and a flexible printed circuit in an annular display apparatus according to an embodiment of the present disclosure.

FIG. 5 is a schematic diagram of an inner non-display region of a display panel and a flexible printed circuit in an annular display apparatus according to an embodiment of the present disclosure. As shown in FIG. 5, in an embodiment, the bonding region 31 of the flexible printed circuit 31 has an outer ring C31 and an inner ring C32, and the inner non-display region BA2 of the display panel has an outer ring C11 and an inner ring C12. Further, a circumference of the outer ring C31 of the bonding region 31 is greater than that of the inner ring C12 of the inner non-display region BA2, to ensure that the bonding region 31 can be bound to the inner non-display region BA2. In one embodiment, a circumference of the inner ring C32 of the bonding region 31 is greater than the circumference of the inner ring C12 of the inner non-display region BA2, to ensure that the entire bonding region 31 is located in the inner non-display region BA2, thereby increasing the firmness of the binding.

Figure 6:
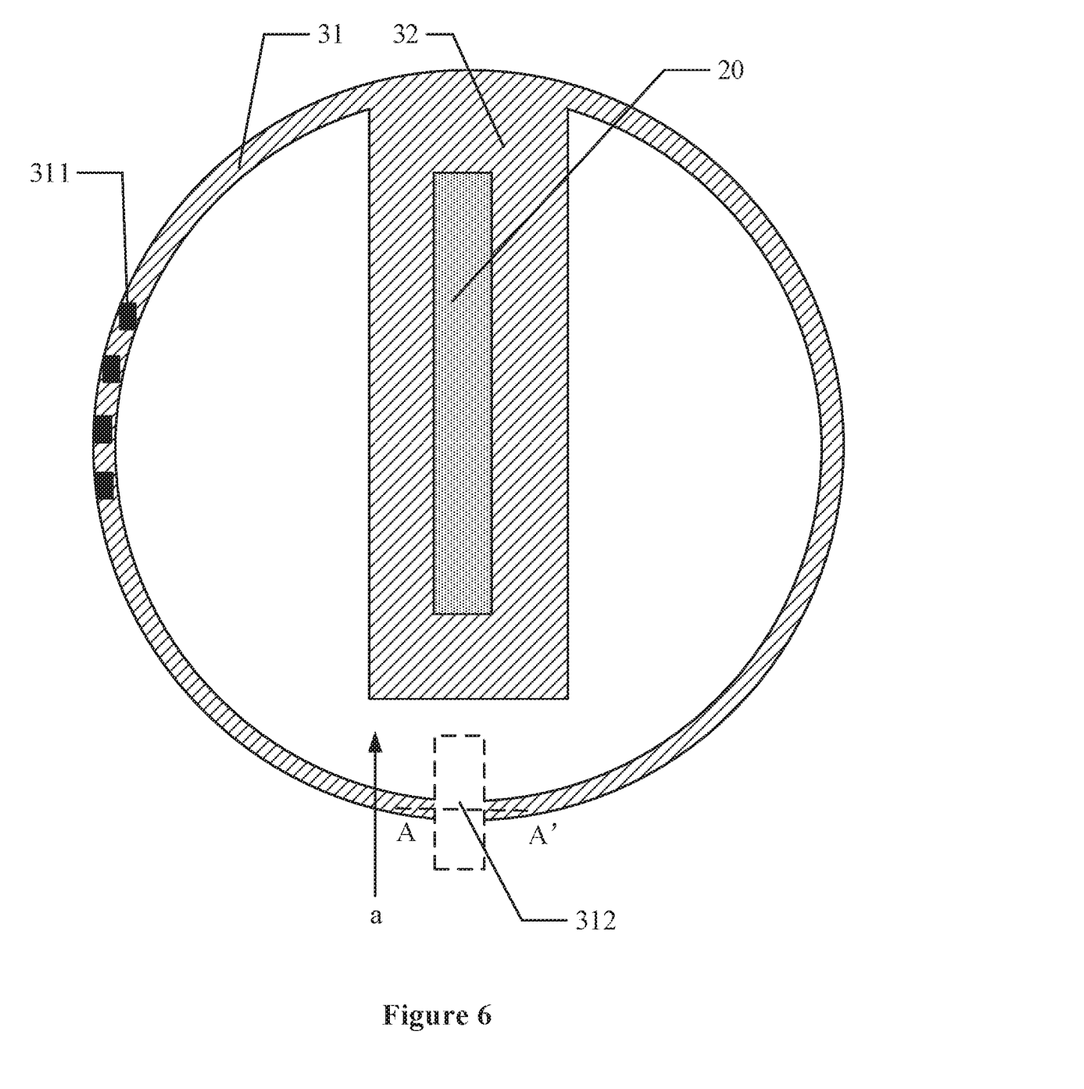
FIG. 6 is a schematic diagram of a flexible printed circuit in an annular display apparatus according to another embodiment of the present disclosure.

FIG. 6 is a schematic diagram of a flexible printed circuit in an annular display apparatus according to another embodiment of the present disclosure. As shown in FIG. 6, in an embodiment, the bonding region 31 is provided with an opening 312 extending through the bonding region 31 in a direction (a direction a indicated by the arrow in FIG. 6) intersecting with a surrounding direction of the inner non-display region BA2 (that is, a circumferential direction of the inner non-display region BA2). With this embodiment, the opening is provided for compensating a change of the circumference of the bonding region of the flexible printed circuit due to an influence of a flexible printed circuit manufacturing process and thermal expansion of the flexible printed circuit, thereby avoiding a problem that the circuit board binding interfaces cannot be accurately aligned and connected with the panel binding interfaces due to a change of the circumference of the bonding region.

Figure 7:
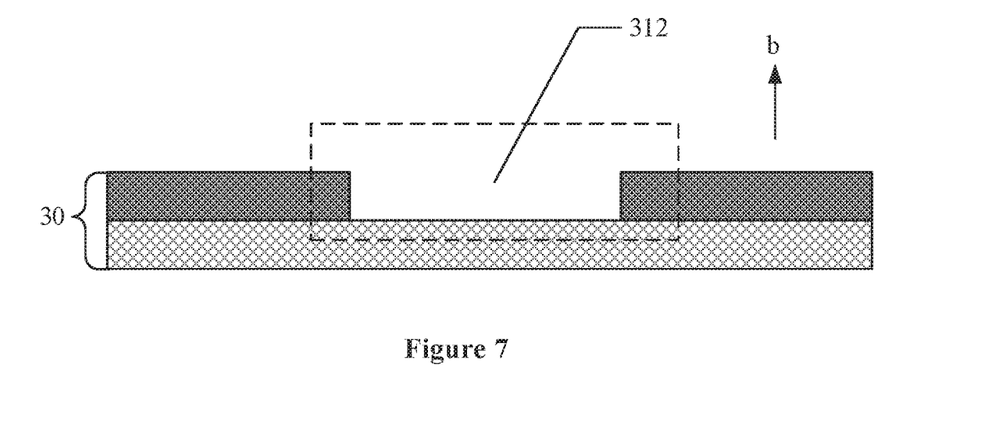
FIG. 7 is a schematic structural diagram of film layers of a flexible printed circuit in an annular display apparatus according to an embodiment of the present disclosure.

FIG. 7 is a schematic structural diagram of film layers of a flexible printed circuit in an annular display apparatus according to an embodiment of the present disclosure, and. FIG. 7 is a sectional view taken along a line A-A' in FIG. 6. As shown in FIG. 7, in an embodiment, the flexible printed circuit 30 includes multiple film layers, and the opening 312 extends through some of the film layers of the flexible printed circuit 30 in a direction perpendicular to the flexible printed circuit 30 (a direction b indicated by the arrow in FIG. 7). In one embodiment, the opening 312 extends through only a film layer of the flexible printed circuit 30 which has a high thermal expansion rate, such that not only an error in the circumference of the bonding region due to the thermal expansion of the flexible printed circuit 30 can be compensated, but also the continuity of the flexible printed circuit in the circumferential direction can be ensured.

Figure 8:
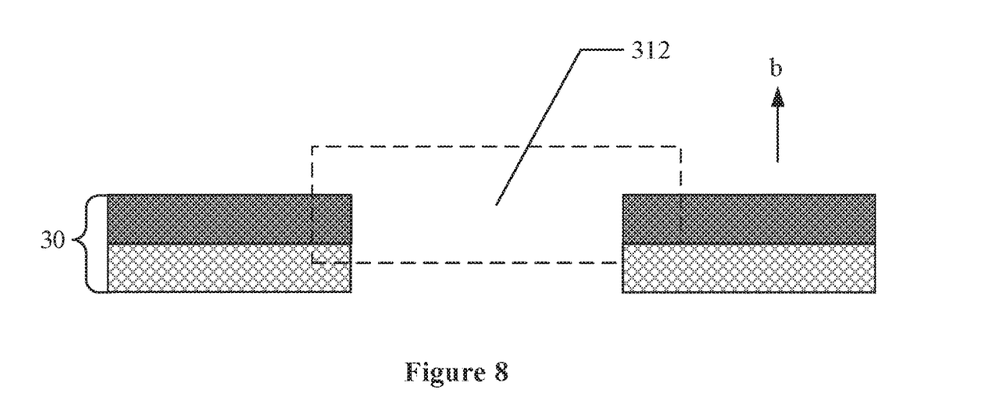
FIG. 8 is a schematic structural diagram of film layers of a flexible printed circuit in an annular display apparatus according to an embodiment of the present disclosure.

FIG. 8 is a schematic structural diagram of film layers of a flexible printed circuit in an annular display apparatus according to an embodiment of the present disclosure, and FIG. 8 is a sectional view taken along a line A-A' in FIG. 6. As shown in FIG. 8, in an embodiment, the flexible printed circuit 30 includes multiple film layers, and the opening 312 extends through all of the film layers of the flexible printed circuit 30 in the direction perpendicular to the flexible printed circuit 30 (the direction b indicated by the arrow in FIG. 7), such that the error in the circumference of the bonding region of the flexible printed circuit 30 due to any factor can be compensated.

It is to be noted that, FIG. 7 and FIG. 8 schematically show only some cases of the opening 312 extending through the flexible printed circuit 30, and a structure of the film layers of the flexible printed circuit is not specifically limited.

Figure 9:
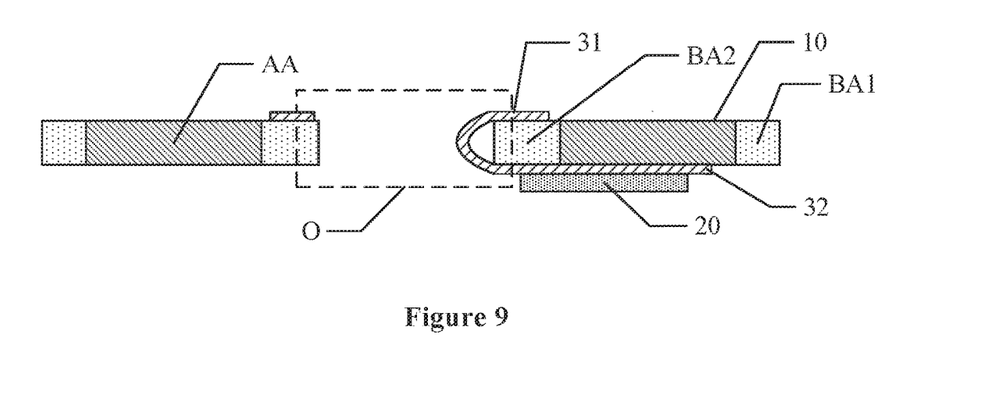
FIG. 9 is a schematic diagram of a flexible printed circuit having another structure in an annular display apparatus according to another embodiment of the present disclosure.

In an embodiment, referring to FIG. 4, the chip region 32 extends from the bonding region 31 to the hollow region of the annular display apparatus. FIG. 9 is a schematic diagram of a flexible printed circuit having another structure in an annular display apparatus according to another embodiment of the present disclosure. Referring to FIG. 9, the chip region 32 is foldable to a non-display side of the display region AA. Taking an orientation in FIG. 9 as an example, an upper side of the display device is a display side, and a lower side of the display device is the non-display side, the chip region 32 is folded to the non-display side of the display region AA, and the vacated hollow region 0 may be used for arranging other devices of the display device, such as a battery device, a camera device and an earpiece device.

Figure 10:
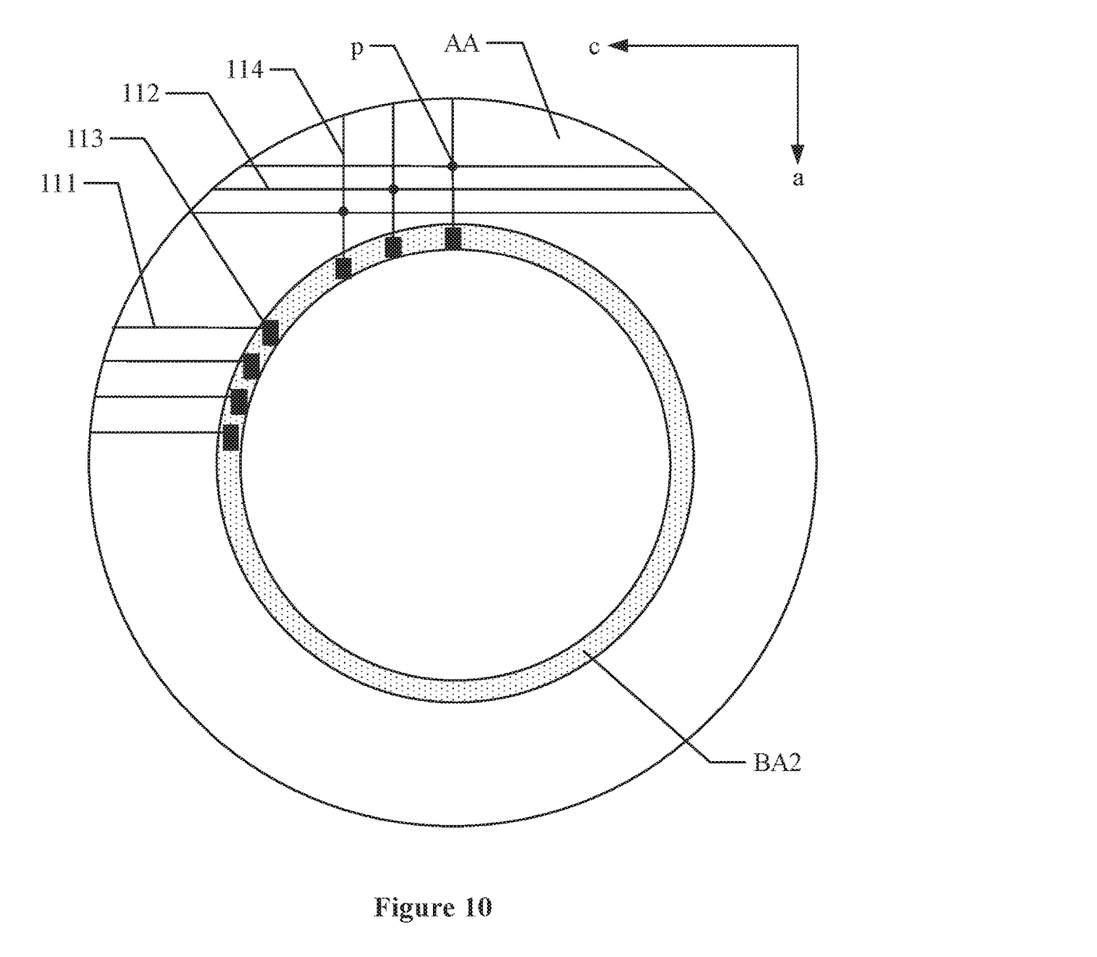
FIG. 10 is a schematic diagram of control signal lines on a display panel in an annular display apparatus according to an embodiment of the present disclosure.

FIG. 10 is a schematic diagram of control signal lines on a display panel in an annular display apparatus according to an embodiment of the present disclosure. As shown in FIG. 10, in an embodiment, the display panel is provided with multiple control signal lines. The multiple control signal lines includes multiple first control signal lines 111, and multiple second control signal lines 112 which extend in a first direction c. The first control signal lines 111 extend from the display region AA to the inner non-display region BA2, and are connected to the panel binding interfaces 113. The second control signal lines 112 do not intersect with the inner non-display region. The display region AA is further provided with multiple first signal connection lines 114 extending in the second direction a. The first direction c intersects with the second direction a. The first signal connection lines 114 extend from the display region AA to the inner non-display region BA2 and are connected to the panel binding interfaces 113. The second control signal lines 112 are respectively connected to the first signal connection lines 114 at points P. In one embodiment, the second control signal lines 112 are connected to the first signal connection lines 114 through via holes or bridging and the like at positions of the points P. That is, for control signal lines extending in the first direction c, some of the control signal lines, that is, the first control signal lines 111, may extend to the inner non-display region BA2, and are directly connected to the panel binding interfaces 113 arranged in the inner non-display region BA2, to receive control signals transmitted through the panel binding interfaces 113. However, some of the control signal lines, that is, the second control signal lines 112, do not extend to the inner non-display region BA2 and may be indirectly connected to the panel binding interfaces 113 arranged in the inner non-display region BA2 through the first signal connection lines 114 extending in the second direction a, to ensure that all of the control signal lines in the display panel can receive the control signals. In an embodiment, the display region includes multiple display pixels and multiple thin film transistors for controlling display of the display pixels. Each of the multiple thin film transistors includes a gate, a source and a drain. Each of the first control signal lines and the second control signal lines may be a scan line, and is connected to the gate of one of the thin film transistors to provide a turn-on voltage signal for the thin film transistor. In one embodiment, each of the first control signal lines and the second control signal lines may be a data line, and is connected to the source of one of the thin film transistors, to provide a pixel voltage signal for the thin film transistor.

With the embodiment, multiple connection lines for connecting the multiple panel binding interfaces with the second control signal lines are arranged in the display region, such that it is unnecessary to wind lines in the inner non-display region, thereby reducing a width of the inner non-display region, thus improving the screen-to-body ratio of the display panel.

Figure 11:
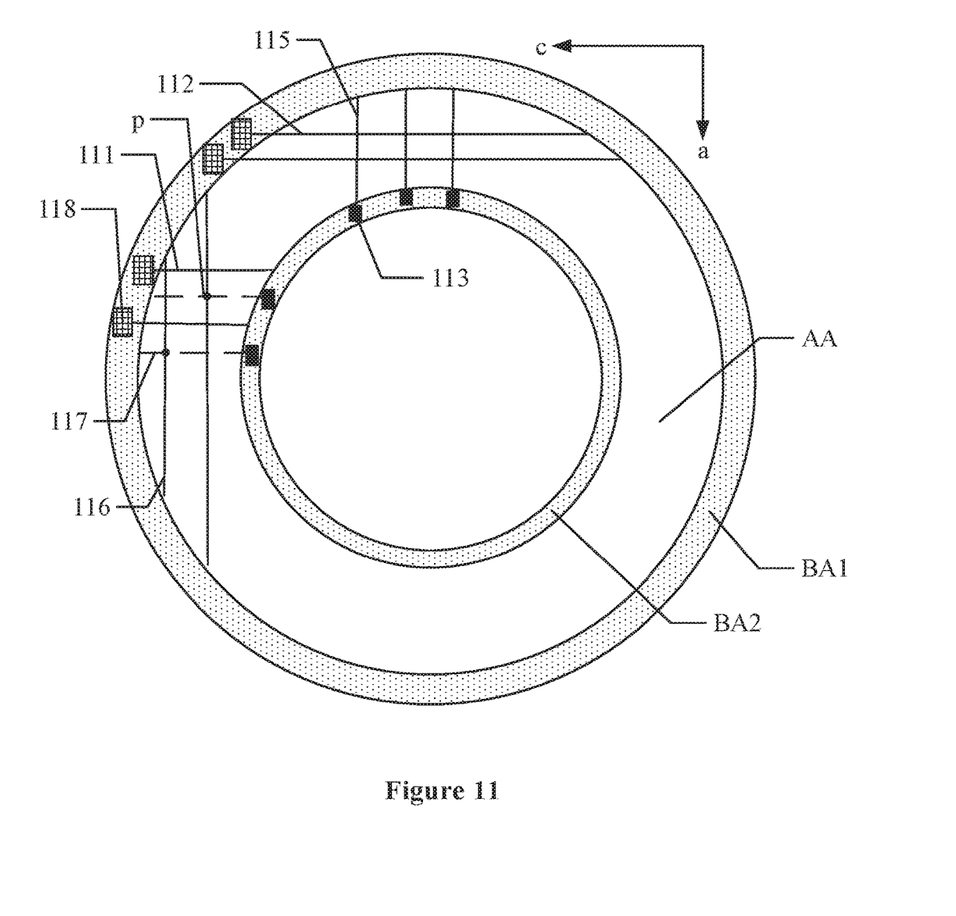
FIG. 11 is a schematic diagram of control signal lines on a display panel in an annular display apparatus according to another embodiment of the present disclosure.

FIG. 11 is a schematic diagram of control signal lines on a display panel in an annular display apparatus according to another embodiment of the present disclosure. In the embodiment, as shown in FIG. 11, the control signal lines include scan lines and data lines. The scan lines includes first control signal lines 111 and second control signal lines 112, where the first control signal lines 111 extend from the display region AA to the inner non-display region BA2, and the second control signal lines 112 do not intersect with the inner non-display region. The data lines includes third control signal lines 115 and fourth control signal lines 116, where the third control signal lines 115 extend from the display region AA to the inner non-display region BA2, and the fourth control signal lines 116 do not intersect with the inner non-display region BA2, An amorphous silicon gate (ASG) for providing a driving signal to the scan line is arranged in the outer non-display region BA1 of the display panel. As shown in FIG. 11, gate drive units 118 included in the amorphous silicon gate are schematically shown. The first control signal lines 111 and the second control signal lines 112 are connected to the gate drive units 118. The third control signal lines 115 are connected to the panel binding interfaces 113. The display region AA is also provided with second signal connection lines 117 extending in the first direction c. The second signal connection lines 117 extend from the display region AA to the inner non-display region BA2 and are connected to the panel binding interfaces 113. The fourth control signal lines 116 are connected to the second signal connection lines 117, respectively.

With the embodiment, the data lines of the display panel are directly connected to the panel binding interfaces, or are connected to the signal connection lines in the display region, such that it is unnecessary to winding lines for connecting the data lines in the inner non-display region, thereby reducing the width of the non-display region, and increasing the screen-to-body ratio of the display panel. In addition, in the embodiment, the ASG circuit for providing signals to the scan lines is arranged in the outer non-display region, and each of the scan lines may be directly connected to the ASG circuit, such that it is unnecessary to arrange a connection signal line for connecting the scan line with the ASG circuit in the display region, thereby reducing the wires in the display region, thus increasing the aperture ratio.

Figure 12:
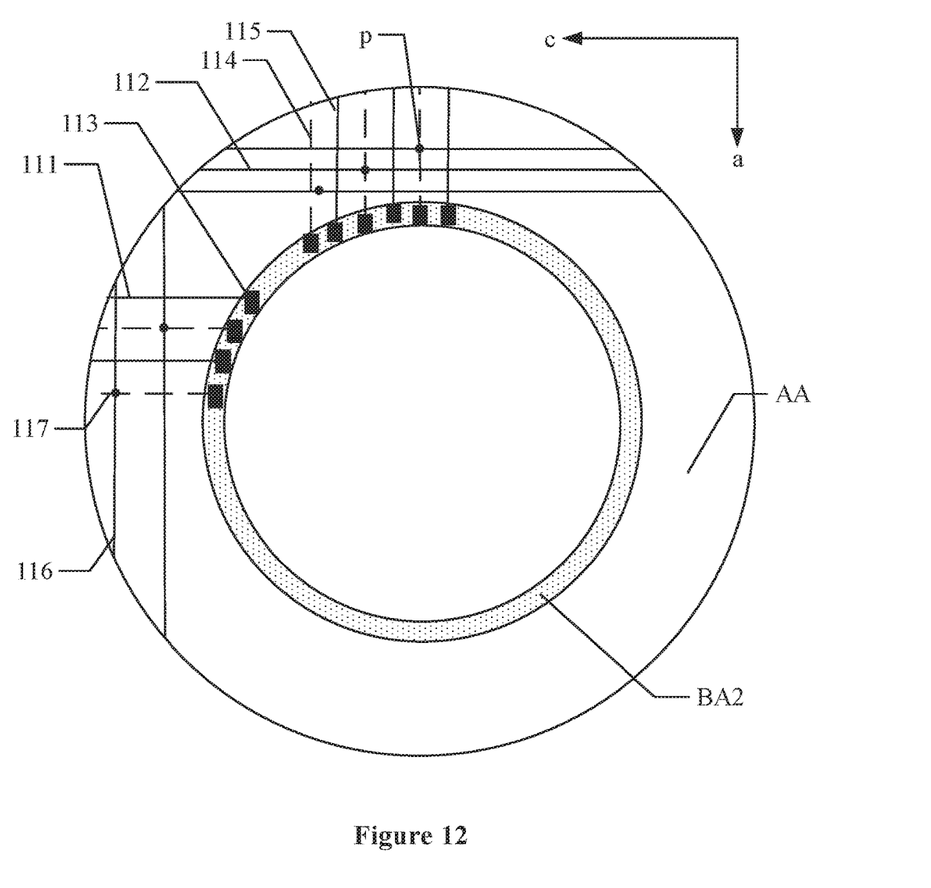
FIG. 12 is a schematic diagram of control signal lines on a display panel in an annular display apparatus according to another embodiment of the present disclosure.

FIG. 12 is a schematic diagram of control signal lines on a display panel in an annular display apparatus according to another embodiment of the present disclosure. In the embodiment, as shown in FIG. 12, the first control signal lines 111 and the second control signal lines 112 are both scan lines, and the control signal lines further include third control signal lines 115 and fourth control signal lines 116 each extending in the second direction a. The third control signal lines 115 extend from the display region AA to the inner non-display region BA2 and are connected to the panel binding interfaces 113. The fourth control signal lines 116 do not intersect with the inner non-display region BA2. The third control signal lines 115 and the fourth control signal lines 116 are data lines. The display region AA is further provided with second signal connection lines 117 extending in the first direction c. The second signal connection lines 117 extend from the display region AA to the inner non-display region BA2 and are connected to the panel binding interfaces 113. The fourth control signal lines 116 are connected to the second signal connection lines 117, respectively. It is to be noted that, in FIG. 12, in order to distinguish between the control signal line and the signal connection line, the control signal line is indicated by a solid line, and the signal connection line is indicated by a dashed line, and only some control signal lines and some signal connection lines are schematically shown in FIG. 12.

With the embodiment, each of the scan line and the data line in the display panel is directly connected to the panel binding interface, or is connected to the signal connection line in the display region, such that it is unnecessary to winding lines in the inner non-display region, thereby reducing the width of the non-display region, and increasing the screen-to-body ratio of the display panel. In addition, in the embodiment, based on the wiring manner of the scan line, it is unnecessary to arrange the amorphous silicon gate (ASG) for providing driving signals to the scan lines in the outer non-display region of the display panel, thereby reducing the width of the outer non-display region and the area of the non-display region of the display panel, such that the screen-to-body ratio can be further increased.

Figure 13:
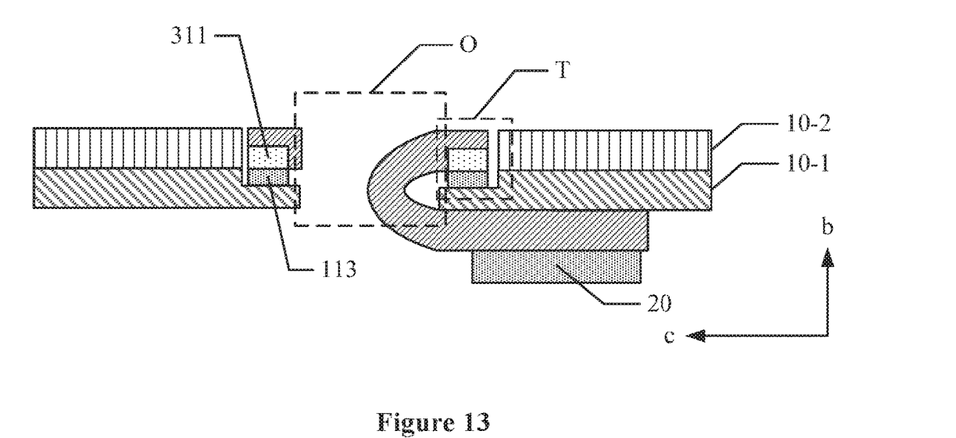
FIG. 13 is a schematic structural diagram of film layers of a display panel in an annular display apparatus according to an embodiment of the present disclosure.

FIG. 13 is a schematic structural diagram of film layers of a display panel in an annular display apparatus according to an embodiment of the present disclosure. As shown in FIG. 13, the display panel includes a first substrate 10-1 and a second substrate 10-2 opposite to each other in a third direction b. The thin film transistors are arranged in the first substrate 10-1. The third direction b is perpendicular to the first direction c and the second direction a. For a liquid crystal display panel, the first substrate 10-1 is an array substrate, and the second substrate 10-2 is a color filter substrate. In the inner non-display region, the first substrate 10-1 extends toward a center of the hollow region C) of the annular display apparatus relative to the second substrate 10-2 to form a step region T. The panel binding interfaces 113 are arranged on the step region In an embodiment, referring to FIG. 13 again, the panel binding interfaces 113 are metal electrodes arranged on the step region T, and the circuit board binding interfaces 311 are gold fingers arranged on the bonding region. The metal electrode is attached with the gold finger, that is, the panel binding interfaces 113 are electrically connected to the circuit board binding interfaces 311.

Figure 14:
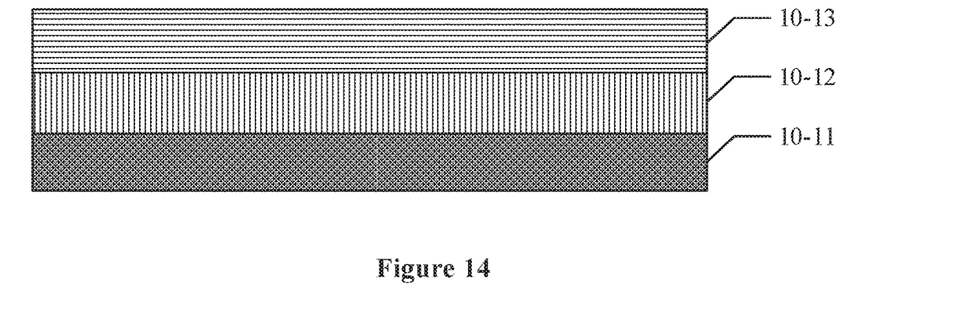
FIG. 14 is a schematic structural diagram of film layers of a first substrate in an annular display apparatus according to an embodiment of the present disclosure.

FIG. 14 is a schematic structural diagram of film layers of a first substrate in an annular display apparatus according to an embodiment of the present disclosure. As shown in FIG. 14, in an embodiment, the first substrate includes a substrate layer 10-11, a first metal layer 10-12 and a second metal layer 10-131. The first metal layer 10-12 is arranged on a side of the substrate layer 10-11 close to the second substrate. The gate of the thin film transistor, the scan lines (including the first control signal lines and the second control signal lines) and the second signal connection lines are arranged in the first metal layer 10-12. The second metal layer 10-13 is arranged on a side of the first metal layer 10-12 close to the second substrate. The source and the drain of the thin film transistor, the data lines (including the third control signal lines and the fourth control signal lines), the first signal connection line and the metal electrode are arranged in the second metal layer 10-13. The second control signal lines are connected to the first signal connection lines through via holes, the fourth control signal lines are connected to the second signal connection lines through via holes, the first control signal lines are connected to the metal electrodes through via holes, and the first signal connection lines are connected to the metal electrodes through via holes.

Figure 15:
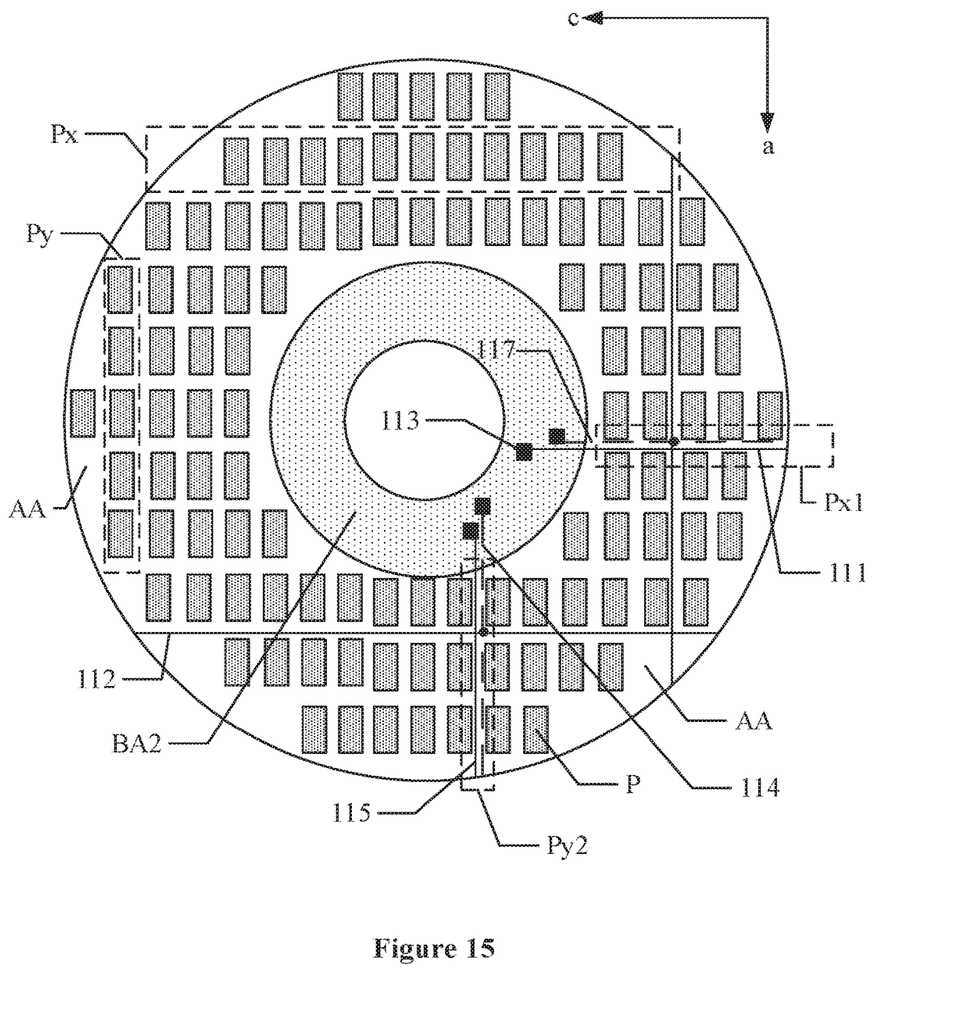
FIG. 15 is a top view of a display panel in an annular display apparatus according to another embodiment of the present disclosure.

FIG. 15 is a top view of a display panel in an annular display apparatus according to another embodiment of the present disclosure. As shown in FIG. 15, in an embodiment, the display region AA of the display panel includes multiple display pixels P. The multiple display pixels P form multiple pixel rows Px and multiple pixel columns Py. The multiple pixel rows Px extend in the first direction c and are arranged in the second direction a. The multiple pixel columns Py extend in the second direction a and are arranged in the first direction c. A first wiring region Px1 is disposed between adjacent pixel rows Px arranged in the second direction a. The first control signal lines 111 or the second control signal lines 112 are arranged in the first wiring region Px1, and the second signal connection lines 117 are arranged in the same first wiring region Px1 as the first control signal lines. A second wiring to region Py2 is disposed between adjacent pixel columns Py arranged in the first direction c. The third control signal lines 115 or the fourth control signal lines 116 are arranged in the second wiring region Py2, and the first signal connection lines 114 are arranged in the same second wiring region Py2 as the third control signal lines 115. It is to be noted that, in FIG. 15, in order to distinguish between the control signal line and the signal connection line, the control signal line is indicated by a solid line, and the signal connection line is indicated by a dashed line, and only some control signal lines and some signal connection lines are schematically shown in FIG. 15.

The above described is embodiments of the annular display apparatus according to the present disclosure. A display device is further provided according to the present disclosure, which includes any one of the annular display apparatuses described above. A structure and corresponding technical effects of the display device are not described herein.

It can be seen from the above embodiments that the following beneficial effects can be achieved with the annular display apparatus and the display device according to the present disclosure.

The multiple panel binding interfaces on the display panel for binding the flexible printed circuit are arranged on the inner side of the display panel, the flexible printed circuit can be arranged in the hollow region at the center of the display panel, and the outer ring of the outer non-display region of the display panel is not affected by the flexible printed circuit, such that the appearance of the entire annular display apparatus is not affected.

The invention claimed is:

1. An annular display apparatus, comprising:
    a display panel, wherein the display panel comprises an annular display region, an outer non-display region extending around an outer side of the display region and an inner non-display region extending around an inner side of the display region, the display region is provided with a plurality of control signal lines, the inner non-display region is provided with a plurality of panel binding interfaces, and the plurality of control signal lines are electrically connected to the plurality of panel binding interfaces respectively;
    an integrated circuit chip; and
    a flexible printed circuit, wherein the flexible printed circuit comprises a bonding region and a chip region, the bonding region is provided with a plurality of circuit board binding interfaces which are bound to the plurality of panel binding interfaces, the chip region is configured to arrange the integrated circuit chip, and the integrated circuit chip is electrically connected to the plurality of circuit board binding interfaces.

2. The annular display apparatus according to claim 1, wherein:
    the bonding region has an annular shape.

3. The annular display apparatus according to claim 2, wherein:
    a circumference of an outer ring of the bonding region is greater an a circumference of an inner ring of the inner non-display region.

4. The annular display apparatus according to claim 2, wherein:
    a circumference of an inner ring of the bonding region is greater than a circumference of an inner ring of the inner non-display region.

5. The annular display apparatus according to claim 2, wherein:
    the bonding region is provided with an opening, the opening extending through the bonding region in a direction which intersects with a circumferential direction of the inner non-display region and is parallel to the flexible printed circuit.

6. The annular display apparatus according to claim 5, wherein:
    the opening extends through the flexible printed circuit in a direction perpendicular to the flexible printed circuit.

7. The annular display apparatus according to claim 2, wherein:
    the chip region extends from the bonding region toward a hollow region at a center of the annular display apparatus, and the chip region is foldable to a non-display side of the display region.

8. The annular display apparatus according to claim 1, wherein:
    the plurality of control signal lines comprise a plurality of first control signal lines and a plurality of second control signal lines extending in a first direction, the plurality of first control signal lines extend from the display region to the inner non-display region and are connected to the panel binding interfaces, and the plurality of second control signal lines do not intersect with the inner non-display region,
    the display region is further provided with a plurality of first signal connection lines extending in a second direction, wherein the first direction is intersected with the second direction, and the plurality of first signal connection lines extend from the display region to the inner non-display region and are connected to the panel binding interfaces, and
    the plurality of second control signal lines are connected to the plurality of first signal connection lines, respectively.

9. The annular display apparatus according to claim 8, wherein:
    the display region comprises a plurality of display pixels and a plurality of thin film transistors configured to control display of the display pixels, each of the plurality of thin film transistor comprises a gate, a source and a drain, and
    each of the plurality of first control signal lines and the plurality of second control signal lines is a scan line or a data line, wherein the scan line is connected to the gate, and the data line is connected to the source.

10. The annular display apparatus according to claim 9, wherein:
    each of the plurality of first control signal lines and the plurality of second control signal lines is the scan line,
    the plurality of control signal lines further comprises a plurality of third control signal lines and a plurality of fourth control signal lines extending in the second direction, wherein the plurality of third control signal lines extend from the display region to the inner non-display region and are connected to the panel binding interfaces, the plurality of fourth control signal lines do not intersect with the inner non-display region, and each of the plurality of third control signal lines and the plurality of fourth control signal lines is the data line,
    the display region is further provided with a plurality of second signal connection lines extending in the first direction from the display region to the inner non-display region and are connected to the panel binding interfaces, and
    the plurality of fourth control signal lines are connected to the plurality of second signal connection lines, respectively.

11. The annular display apparatus according to claim 10, wherein:
    the display panel comprises a first substrate and a second substrate arranged opposite to each other in a third direction, and the plurality of thin film transistors are arranged on the first substrate, the third direction is perpendicular to the first direction and the second direction, and in the inner non-display region, the first substrate extends toward a center of the hollow region of the annular display apparatus relative to the second substrate, to form a step region, and the plurality of panel binding interfaces are arranged on the step region.

12. The annular display apparatus according to claim 11, wherein:
the plurality of panel binding interface are metal electrodes arranged on the step region, and
the plurality of circuit board binding interface are gold fingers arranged on the bonding region.

13. The annular display apparatus according to claim 12, wherein the first substrate comprises:
a substrate layer;
a first metal layer arranged on a side of the substrate layer close to the second substrate, wherein the gate, the scan line and the plurality of second signal connection lines are arranged in the first metal layer; and
a second metal layer arranged on a side of the first metal layer close to the second substrate, wherein
the source, the drain, the data line, the plurality of first signal connection lines and the metal electrodes are arranged in the second metal layer, and
the plurality of second control signal lines are connected with the plurality of first signal connection lines through via holes, the plurality of fourth control signal lines are connected with the plurality of second signal connection lines through via holes, the plurality of first control signal lines are connected with the metal electrodes through via holes, and the plurality of first signal connection lines are connected with the metal electrodes through via holes.

14. The annular display apparatus according to claim 10, wherein
the plurality of display pixels form a plurality of pixel rows and a plurality of pixel columns, the plurality of pixel rows extend in the first direction and are arranged in the second direction, and the plurality of pixel columns extend in the second direction and are arranged in the first direction,
a first wiring region is disposed between adjacent pixel rows arranged in the second direction, wherein the plurality of first control signal lines or the plurality of second control signal lines are arranged in the first wiring region, and the plurality of second signal connection lines are arranged in the same first wiring region as the plurality of first control signal lines,
a second wiring region is disposed between adjacent pixel columns arranged in the first direction, wherein the plurality of third control signal lines or the plurality of fourth control signal lines are arranged in the second wiring region, and the plurality of first signal connection lines are arranged in the same second wiring region as the plurality of third control signal line.

15. The annular display apparatus according to claim 1, wherein:
the annular display apparatus has a circular annular shape.

16. A display device, comprising:
an annular display apparatus, comprising:
a display panel, wherein the display panel comprises an annular display region, an outer non-display region extending around an outer side of the display region and an inner non-display region extending around an inner side of the display region, the display region is provided with a plurality of control signal lines, the inner non-display region is provided with a plurality of panel binding interfaces, and the plurality of control signal lines are electrically connected to the plurality of panel binding interfaces respectively;
an integrated circuit chip; and
a flexible printed circuit, wherein the flexible printed circuit comprises a bonding region and a chip region, the bonding region is provided with a plurality of circuit board binding interfaces which are bound to the plurality of panel binding interfaces, the chip region is configured to arrange the integrated circuit chip, and the integrated circuit chip is electrically connector to the plurality of circuit hoard binding interfaces.

* * * * *